United States Patent
Chen et al.

(10) Patent No.: US 11,799,455 B2
(45) Date of Patent: Oct. 24, 2023

(54) RELAXATION OSCILLATING CIRCUIT

(71) Applicant: HANGZHOU VANGO TECHNOLOGIES, INC., Hangzhou (CN)

(72) Inventors: Pengpeng Chen, Hangzhou (CN); Ling Lin, Hangzhou (CN); Xiangyang Jiang, Hangzhou (CN); Junjie Hong, Hangzhou (CN); Yuyan Liu, Hangzhou (CN)

(73) Assignee: HANGZHOU VANGO TECHNOLOGIES, INC., Hangzhou (CN)

( * ) Notice: Subject to any disclaimer, the term of this patent is extended or adjusted under 35 U.S.C. 154(b) by 0 days.

(21) Appl. No.: 17/909,440

(22) PCT Filed: Mar. 3, 2022

(86) PCT No.: PCT/CN2022/078957
§ 371 (c)(1),
(2) Date: Sep. 6, 2022

(87) PCT Pub. No.: WO2023/159665
PCT Pub. Date: Aug. 31, 2023

(65) Prior Publication Data
US 2023/0283264 A1    Sep. 7, 2023

(30) Foreign Application Priority Data
Feb. 25, 2022    (CN) .......................... 202210176719.5

(51) Int. Cl.
*H03K 3/0231* (2006.01)
*H03K 3/011* (2006.01)
(Continued)

(52) U.S. Cl.
CPC .......... *H03K 3/0231* (2013.01); *H03K 3/011* (2013.01); *H03K 3/014* (2013.01); *H03K 17/284* (2013.01)

(58) Field of Classification Search
CPC ..... H03K 3/011; H03K 3/0231; H03K 17/284
(Continued)

(56) References Cited

U.S. PATENT DOCUMENTS 5,491,456 A * 2/1996 Kay ........................ H03L 7/099
331/173
5,699,024 A * 12/1997 Manlove ................ H03L 1/022
331/113 R
(Continued)

*Primary Examiner* — Levi Gannon
(74) *Attorney, Agent, or Firm* — JCIPRNET

(57) ABSTRACT

Provided is a relaxation oscillating circuit, which comprises a charging circuit, a discharging circuit, a switch circuit, a charging-discharging capacitor and an output circuit. The charging circuit comprises a first current source and a first isolating transistor. The discharging circuit comprises a second current source and a second isolating transistor. The switch circuit comprises a main charging transistor and an auxiliary charging transistor arranged as mirror and a main discharging transistor and an auxiliary discharging transistor arranged as mirror. The main charging transistor and the main discharging transistor are alternately conducted. According to a voltage of the charging-discharging capacitor, the output circuit outputs a clock signal and a control signal. The clock signal is connected to control ends of the auxiliary charging transistor and the auxiliary discharging transistor, and the control signal is connected to control ends of the main charging transistor and the main discharging transistor.

8 Claims, 4 Drawing Sheets

(51) Int. Cl.
*H03K 17/284* (2006.01)
*H03K 3/014* (2006.01)

(58) Field of Classification Search
USPC .................................. 331/111, 143–145, 153
See application file for complete search history.

(56) References Cited

U.S. PATENT DOCUMENTS

| | | | | |
|---|---|---|---|---|
| 7,034,627 B1* | 4/2006 | Kudari | ................. | H03K 3/0231 |
| | | | | 331/111 |
| 2014/0354364 A1* | 12/2014 | Muller | ................. | H03K 3/0231 |
| | | | | 331/18 |
| 2016/0079917 A1* | 3/2016 | Holzmann | ............ | H01L 29/772 |
| | | | | 331/70 |
| 2019/0190503 A1* | 6/2019 | Fan | ......................... | H03K 4/50 |

* cited by examiner

RELAXATION OSCILLATING CIRCUIT

CROSS-REFERENCE TO RELATED APPLICATION

This application is a 371 of international application of PCT application serial no. PCT/CN2022/078957, filed on Mar. 3, 2022, which claims the priority benefit of China application no. 202210176719.5, filed on Feb. 25, 2022. The entirety of each of the above mentioned patent applications is hereby incorporated by reference herein and made a part of this specification.

BACKGROUND

Technical Field

The present invention relates to the technical field of electronics, and more particularly, to a relaxation oscillating circuit.

Description of Related Art

Relaxation oscillating circuits are widely used in chips as clock sources due to the characteristics of simple structure and fast oscillation start of the relaxation oscillating circuits, to replace external crystal oscillators for cost cut down.

The existing relaxation oscillating circuit solutions mainly comprise a constant voltage mode and a constant current mode. The constant voltage mode is to change an oscillation frequency by trimming a switched resistor. In this mode, a switched resistor is in an oscillating loop, which causes great parasitism and poor output signal accuracy and temperature stability. The constant current mode is to change the oscillation frequency by trimming a current. In this mode, the switch is outside the oscillating loop, which avoids the influence of the switch resistance on the oscillating loop. However, a parasitic capacitor of the current transistor mode also affects the accuracy and temperature stability of the circuit, especially when the oscillation frequency increases.

SUMMARY

In order to overcome at least one problem of the prior art, the present invention provides a relaxation oscillating circuit with high accuracy and high temperature stability.

To implement the foregoing objects, the present invention provides a relaxation oscillating circuit, which comprises a charging circuit, a discharging circuit, a switch circuit, a charging-discharging capacitor and an output circuit. The charging circuit comprises a first current source and a first isolating transistor for isolating a parasitic capacitor of the first current source transistor. The discharging circuit comprises a second current source and a second isolating transistor for isolating a parasitic capacitor of the second current source transistor. The switch circuit comprises a main charging transistor and an auxiliary charging transistor arranged as mirror and a main discharging transistor and an auxiliary discharging transistor arranged as mirror, wherein the first current source is connected to the main charging transistor and the auxiliary charging transistor via the first isolating transistor, and the second current source is connected to the main discharging transistor and the auxiliary discharging transistor via the second isolating transistor. The charging-discharging capacitor is connected to the main charging transistor and the main discharging transistor respectively, wherein the main charging transistor and the main discharging transistor are alternately conducted for two half cycles of a clock signal, and access the charging-discharging capacitor to the charging circuit and the discharging circuit respectively. Based on a voltage of the charging-discharging capacitor, the output circuit outputs a clock signal and a control signal which is reversed with the clock signal and ahead of the clock signal, and the clock signal is accessed to gates of the auxiliary charging transistor and the auxiliary discharging transistor, the control signal is accessed to gates of the main charging transistor and the main discharging transistor respectively.

According to one embodiment of the present invention, the first current source comprises at least one first switch transistor in cascode structure with the first isolating transistor, and a size of the first isolating transistor is smaller than a size of the first switch transistor; and the second current source comprises at least one second switch transistor in cascode structure with the second isolating transistor, and a size of the second isolating transistor is smaller than a size of the second switch transistor.

According to one embodiment of the present invention, when the first current source comprises a plurality of first switch transistors arranged as mirror, the number of the first switches accessed is adjusted to trim a charging current; and when the second current source comprises a plurality of second switch transistors arranged as mirror, a number of the second switch transistors accessed is adjusted to trim a discharging current.

According to one embodiment of the present invention, the first current source further comprises a plurality of first single-pole double-throw switches arranged corresponding to the plurality of first switch transistors, movable ends of the first single-pole double-throw switches are connected to gates of the corresponding first switch transistors, and two fixed ends of the first single-pole double-throw switches are connected to a power supply and bias voltages of the first switch transistors respectively; the second current source further comprises a plurality of second single-pole double-throw switches arranged corresponding to the plurality of second switch transistors, movable ends of the second single-pole double-throw switches are connected to gates of the corresponding second switch transistors, and two fixed ends of the second single-pole double-throw switches are grounded and bias voltages of the second switch transistors respectively.

According to one embodiment of the present invention, the output circuit comprises a first inverter, a second inverter and a third inverter which are connected in sequence, an output of the switch circuit is connected to the charging-discharging capacitor and the first inverter respectively, the third inverter outputs a clock signal, the second inverter outputs the control signal connected to the gates of the main charging transistor and the main discharging transistor, and the timing of the control signal is ahead of the clock signal based on a delay of the third inverter.

According to one embodiment of the present invention, the charging-discharging capacitor comprises a first capacitor and a second capacitor, one end of the first capacitor is connected to an output of the second inverter, the other end of the first capacitor is grounded via the second capacitor, and the output of the switch circuit is connected to a junction of the first capacitor and the second capacitor to adjust a charging-discharging node voltage based on the first capacitor and the second capacitor.

According to one embodiment of the present invention, the relaxation oscillating circuit further comprises a bias circuit which provides a bias voltage and a temperature independent charging-discharging current for the first current source transistor, the first isolating transistor, the second current source and the second isolating transistor.

According to one embodiment of the present invention, the bias circuit comprises:

a bandgap reference circuit, which provides a temperature independent reference voltage;

a transconductance amplifier with a negative input end connected to the bandgap reference circuit, and a positive input end connected to a temperature independent resistor, the reference voltage and a resistance value of the temperature independent resistor determine the temperature independent current output by the bias circuit; and a bias voltage generating circuit connected to an output of the transconductance amplifier and the temperature independent resistor, and outputting a bias voltage of the first switch transistor and a bias voltage of the first isolating transistor in the first current source transistor, and a bias voltage of the second switch transistor and a bias voltage of the second isolating transistor in the second current source respectively.

According to one embodiment of the present invention, the temperature independent resistor is composed of at least one positive temperature coefficient resistor and at least one negative temperature coefficient resistor.

In conclusion, in the relaxation oscillating circuit provided by the present invention, the charging circuit and the discharging circuit respectively adopt the first isolating transistor and the second isolating transistor to isolate the first current source and the second current source transistor, so as to avoid the influence of the large parasitic capacitors of the two current source transistors on the charging-discharging capacitor, thus greatly improving the output frequency accuracy of the clock signal. Further, in the switch circuit, the auxiliary charging transistor and the main charging transistor are arranged as mirror, and the auxiliary discharging transistor and the main discharging transistor are arranged as mirror; and the control signal for controlling the main charging transistor and the main discharging transistor is reversed with the clock signal and ahead of the clock signal for controlling the auxiliary charging transistor and the auxiliary discharging transistor. With this arrangement, when the clock signal turns over, the main charging transistor is switched on ahead of the switching-off of the auxiliary charging transistor. During this time period, the main charging transistor and the auxiliary charging transistor are both switched on. In this case, the change of the drain voltage of the first isolating transistor is only related to gate-source voltages of the main charging transistor and the auxiliary charging transistor, and the voltage change is very small, thus greatly reducing influences of a drain capacitor of the first isolating transistor on the charging-discharging capacitor. Similarly, the main discharging transistor is also switched on ahead of the switching-off of the auxiliary discharging transistor. In this case, the change of the drain voltage of the second isolating transistor is only related to gate-source voltages of the main discharging transistor and the auxiliary discharging transistor, which effectively reduces influences of a drain capacitor of the second isolating transistor on the charging-discharging capacitor, and further improves the output accuracy of the clock signal.

To make the above and other objects, features and advantages of the present invention more obvious and easier to understand, the preferred embodiments will be described in detail below in conjunction with the attached drawings.

DETAILED DESCRIPTION OF DISCLOSED EMBODIMENTS

In the existing relaxation oscillating circuit based on a constant current mode, a parasitic capacitor of the current transistor may be introduced into an oscillating loop. For the frequency-adjustable relaxation oscillating circuit, the parasitic capacitor of the current transistor is large, which has a particularly serious influence on a charging-discharging capacitor.

Figure 1:
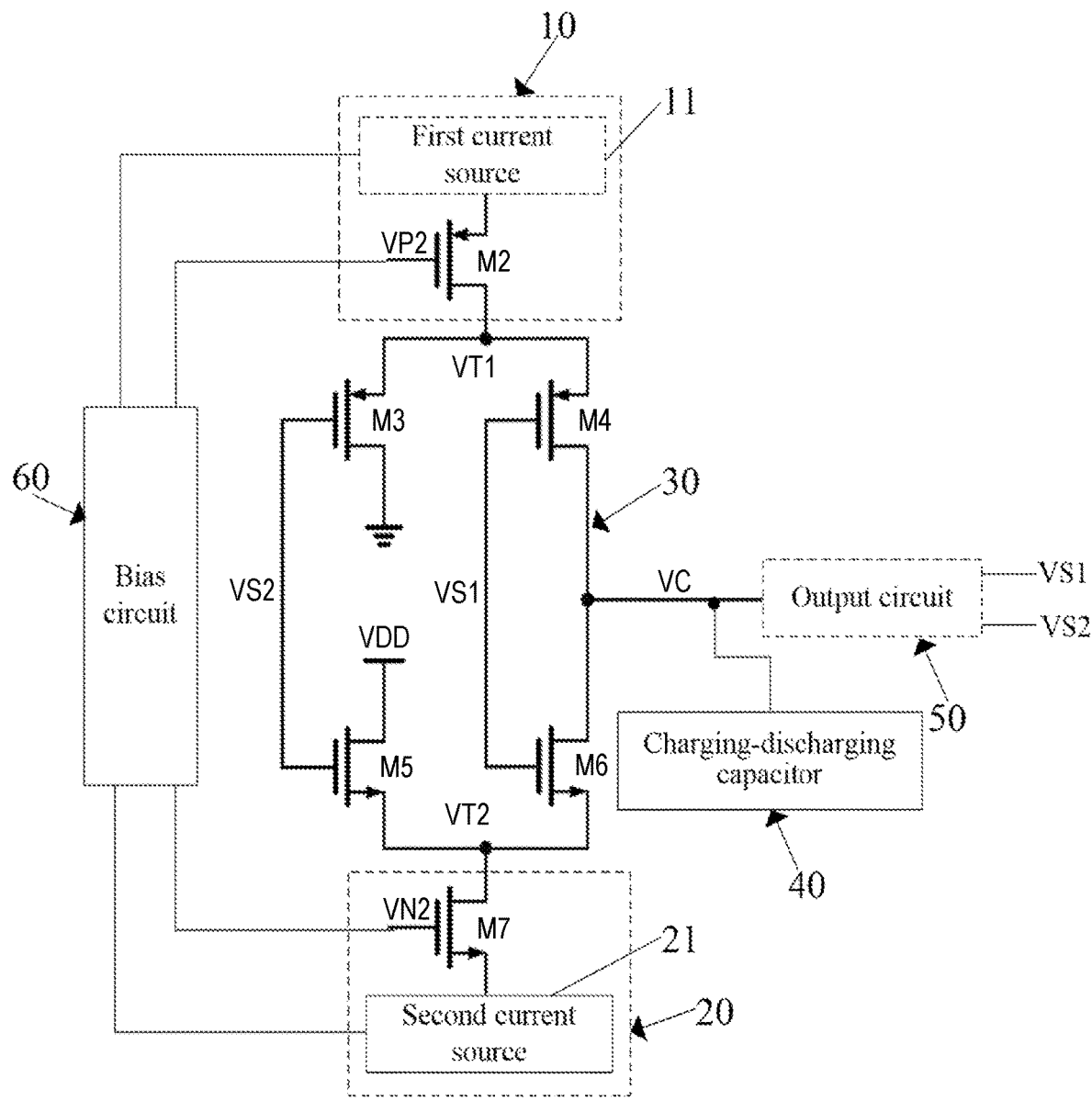
FIG. 1 shows a functional block diagram of a relaxation oscillating circuit provided by one embodiment of the present invention.

In light of this, this embodiment provides a high-accuracy relaxation oscillating circuit which can greatly reduce the influence of the parasitic capacitor. As shown in FIG. 1, the relaxation oscillating circuit provided by this embodiment comprises a charging circuit 10, a discharging circuit 20, a switch circuit 30, a charging-discharging capacitor 40 and an output circuit 50. The charging circuit 10 comprises a first current source 11 and a first isolating transistor M2 for isolating a parasitic capacitor of the first current source 11. The discharging circuit 20 comprises a second current source 21 and a second isolating transistor M7 for isolating a parasitic capacitor of the second current source 21. The switch circuit 30 comprises a main charging transistor M4 and an auxiliary charging transistor M3 arranged as mirror and a main discharging transistor M6 and an auxiliary discharging transistor M5 arranged as mirror. The first current source 11 is connected to the main charging transistor M4 and the auxiliary charging transistor M3 via the first isolating transistor M2, and the second current source 21 is connected to the main discharging transistor M6 and the auxiliary discharging transistor M5 via the second isolating transistor M7. The charging-discharging capacitor 40 is connected to the main charging transistor M4 and the main discharging transistor M6 respectively. The main charging transistor M4 and the main discharging transistor M6 are alternately conducted for two half cycles of a clock signal, and access the charging-discharging capacitor 40 to the charging circuit 10 or the discharging circuit 20 respectively. The output circuit 50, based on a voltage of the charging-discharging capacitor 40, outputs a clock signal VS2 and control signal VS1 which is inversely ahead of the clock signal VS2, wherein the clock signal VS2 is accessed to gates of the auxiliary charging transistor M3 and the auxiliary discharging transistor M5, and the control signal VS1 is accessed to gates of the main charging transistor M4 and the main discharging transistor M6 respectively.

In the relaxation oscillating circuit provided by this embodiment, the first isolating transistor M2 and the second isolating transistor M7 with small drain capacitor are used to isolate the introduction of large parasitic capacitors of the first current source 11 and the second current source 21, thus effectively avoiding the influence of the large parasitic capacitors of the two current sources on the charging-discharging capacitor 40 and improving the accuracy of the clock signal. The time sequence control based on the control signal VS1 and the clock signal VS2 realizes the stability of drain voltages VT1 and VT2 of the two isolating transistors, thus greatly reducing the influence of drain capacitors of the isolating transistors on the charging-discharging capacitor 40, and further improving an accuracy of the circuit.

As shown in FIG. 1, the charging-discharging capacitor 40 is connected to the charging circuit 10 or the discharging circuit 20 through the main charging transistor M4 and the main discharging transistor M6 alternately conducted on the switch circuit 30 for two half cycles of the clock signal respectively. The charging-discharging capacitor 40 continuously cycles the charging-discharging process. The output circuit 50 inverts based on the voltage VC on the charging-discharging capacitor 40 to periodically output the clock signal VS2 and a control signal VS1 which is inversely ahead of the clock signal VS2 and used to control the auxiliary charging transistor M3 and the auxiliary discharging transistor M5. FIG. 3 shows a time sequence of the voltage VC, the control signal VS1 and the clock signal VS2. Influences of a timing relationship between the control signal VS1 and the clock signal VS2 on the parasitic capacitors of the first isolating transistor M2 and the second isolating transistor M7 will be described in detail below with reference to FIG. 2 and FIG. 3.

When the voltage VC on the charging-discharging capacitor 40 is discharged lower than a turnover voltage of the output circuit 50, the output circuit 50 outputs a low-level control signal VS1 in advance, and outputs a high-level clock signal VS2 after a delay time T. The control signal VS1 in advance makes the main charging transistor M4 be conducted before the auxiliary charging transistor M3 is switched off, that is, when the main charging transistor M4 is switched on, there will be a short moment (i.e. the delay time T) when the clock signal VS2 is also at a low level, that is, the auxiliary charging transistor M3 is not turned off yet. In this case, fluctuations of a drain voltage VT1 of the first isolating transistor M2 are only related to variations of gate-source voltages of the main charging transistor M4 and the auxiliary charging transistor M3, and the variation range is very small, thus greatly reducing the influences of a drain parasitic capacitor of the first isolating transistor M2 on the charging-discharging capacitor when the charging current is accessed. If the clock signal VS2 is ahead of the control signal VS1, the auxiliary charging transistor M3 is already switched off before the main charging transistor M4 is switched on. Based on the access of the charging circuit 10, the drain voltage VT1 of the first isolation transistor M2 may rapidly rise to a power supply voltage VDD. With the switching on of the main charging transistor M4, the drain voltage VT1 of the first isolation transistor M2 may drop again. That is, in the process of the main charging transistor M4 being switched off to on, the voltage VT1 may change in a large range, which will lead to the charging-discharging of the drain parasitic capacitor of the first isolating transistor M2 following the large change of the drain voltage, thus seriously affecting a charging duration of the charging current to the charging-discharging capacitor 40, and further affecting an accuracy of the output clock signal.

Similarly, the control signal VS1 reverse with the clock signal VS2 and ahead of the clock signal VS2 in timing also makes the auxiliary discharging transistor M5 be not switched off when the main discharging transistor M6 is switched on to connect the discharging circuit 20 to the charging-discharging capacitor 40. In this case, a drain voltage VT2 of the second isolating transistor M7 is only related to fluctuations of gate-source voltages of the main discharging transistor M6 and the auxiliary discharging transistor M5, and the variation range of the voltages is very small, so the introduction of a drain parasitic capacitor of the second isolating transistor M7 is greatly reduced.

In this embodiment, the first current source 11 in the charging circuit 10 comprises a plurality of first switch transistors M1_1, M1_2, ..., M1_N arranged as mirror, a source of each switch transistor is connected to the power supply VDD, and a drain of each switch transistor is connected to a source of the first isolating transistor M2. That is, each switch transistor is in cascode structure with the first isolating transistor M2. For the charging circuit 10 with the cascode structure, the charging current can be trimmed only by adjusting the plurality of first switch transistors as common source transistors, thus adjusting the frequency of the clock signal. A size of the first isolating transistor M2, which serves as a common gate transistor, may be fixed and a smaller size may be selected to further reduce the influence of the drain parasitic capacitor of the first isolating transistor M2 on the charges for charging-discharging. In the discharging circuit 20, the second current source 21 comprises a plurality of second switch transistors M8_1, M8_2, ..., M8_N, which are in cascode structure with the second isolating transistor M7. Sources of the second switch transistors M8_1, M8_2, ..., M8_N, which serve as common source transistors, are grounded, and drains of the second switch transistors are connected to a source of the second isolating transistor M7. Similarly, the discharging current can be trimmed only by adjusting the plurality of second switch transistors as common source transistors, thus adjusting the frequency of the clock signal. A size of the second isolating transistor M7, which serves as a common gate transistor, may be fixed and a smaller size may be selected to further reduce the influence of the drain parasitic capacitor of the second isolating transistor M7 on the charges for charging-discharging.

In this embodiment, the first switch transistors are all PMOS transistors, and the first isolating transistor M2 is a PMOS transistor; the second switch transistors are all NMOS transistors, and second isolating transistor M7 is a NMOS transistor. The first switch transistors M1_1, M1_2, ..., M1_N and the second switch transistors M8_1, M8_2, ..., M8_N adopt the same size ratio. When the number of the first switch transistors and the number of second switch transistors accessed are equal, the duty cycle of the output clock signal is 50%. However, the present invention is not limited to this. In other embodiments, the number of the first switch transistors and the number of the second switch transistors accessed may be different to realize the output of clock signals with different duty cycle. Or in other embodiments, the first current source may only comprise one first switch transistor, and the second current source may only comprise one second switch transistor.

To realize the control of the number of the first switch transistors and the number of the second switch transistors accessed, in this embodiment, the first current source 11 further comprises a plurality of first single-pole double-throw switches SW1_1, SW1_2, ..., SW1_N arranged correspondingly to the first switch transistors M1_1, M1_2, ..., M1_N. Movable ends of the first single-pole double-throw switches are connected to gates of the corresponding first switch transistors, and two fixed ends of the first single-pole double-throw switches are connected to a power supply VDD and bias voltages VP1 of the first switch transistors respectively. In the first current source 11, when the movable end of the first single-pole double-throw switch is connected to the power supply VDD, a gate (control end)

and a source of the corresponding first switch transistor are both connected to the power supply VDD, and then the corresponding first switch transistor is in off state. When a current of the first current source 11 needs to be adjusted to change the charging duration, the first single-pole double-throw switch corresponding to the first switch transistor is switched to the bias voltage VP1, and then the first switch is accessed to the first current source.

Similarly, the second current source 21 further comprises a plurality of second single-pole double-throw switches SW1_2, SW2_2, . . . , SW2_N arranged corresponding to the plurality of second switch transistors M8_1, M8_2, . . . , M8_N, movable ends of the second single-pole double-throw switches are connected to gates of the corresponding second switch transistors, and two fixed ends of the second single-pole double-throw switches are grounded and bias voltages VN1 of the second switch transistors respectively. When the second single-pole double-throw switch is connected to the ground, a gate (control end) and a source of the corresponding second switch transistor are both grounded, and then the second switch transistor is in off state. When a current of the second current source 21 needs to be adjusted to change the discharging duration, the corresponding second single-pole double-throw switch is switched to the bias voltage VN1, and then the second switch transistor is accessed into the second current source 21. The first current source 11 and the second current source 21 provided by this embodiment are both connected in the single-pole double-throw switch mode, and whether each first switch transistor and each second switch transistor are connected to the charging-discharging capacitor 40 or not is controlled by the corresponding single-pole double-throw switch.

Figure 2:
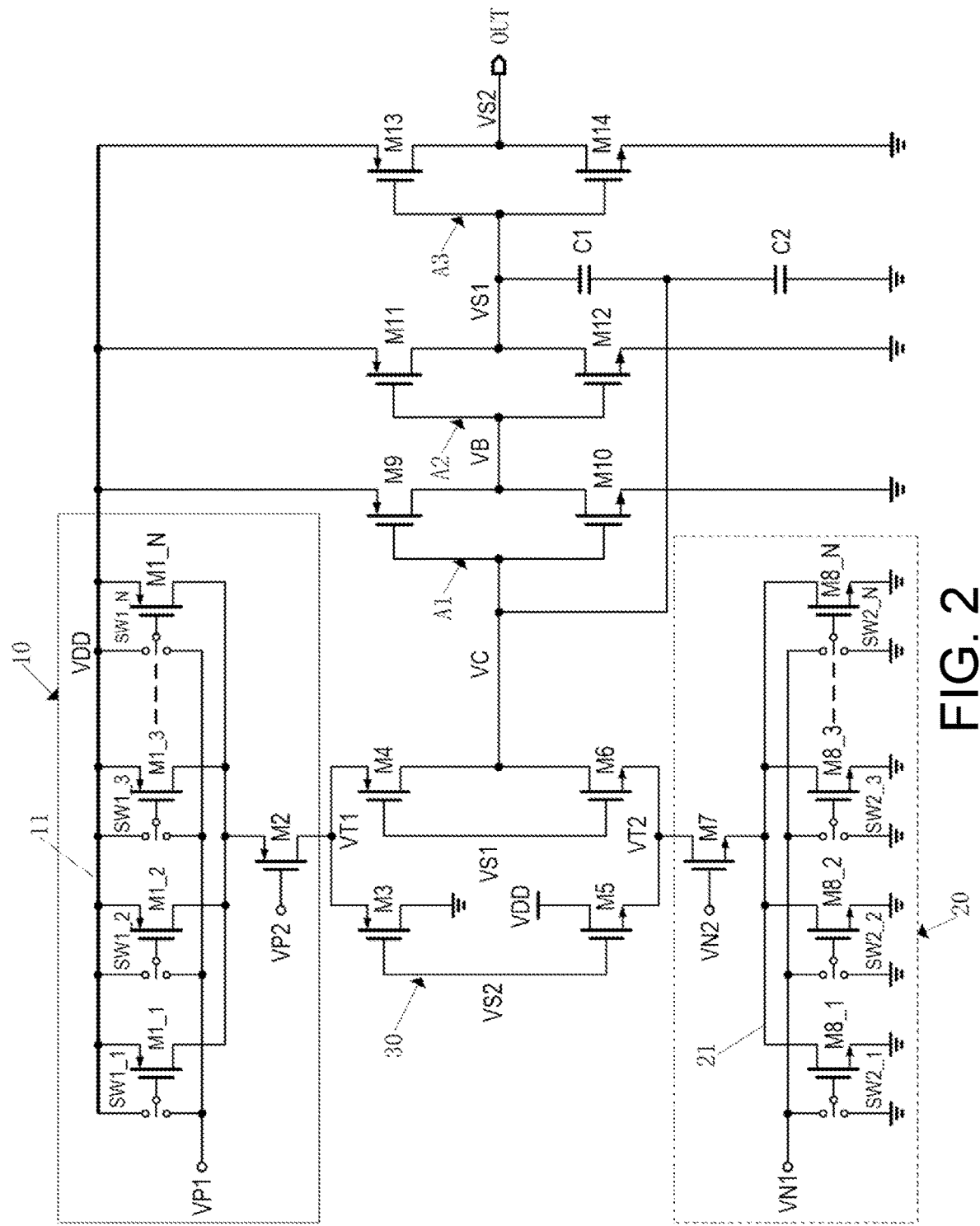
FIG. 2 shows a schematic diagram of the relaxation oscillating circuit provided by one embodiment of the present invention.
Figure 3:
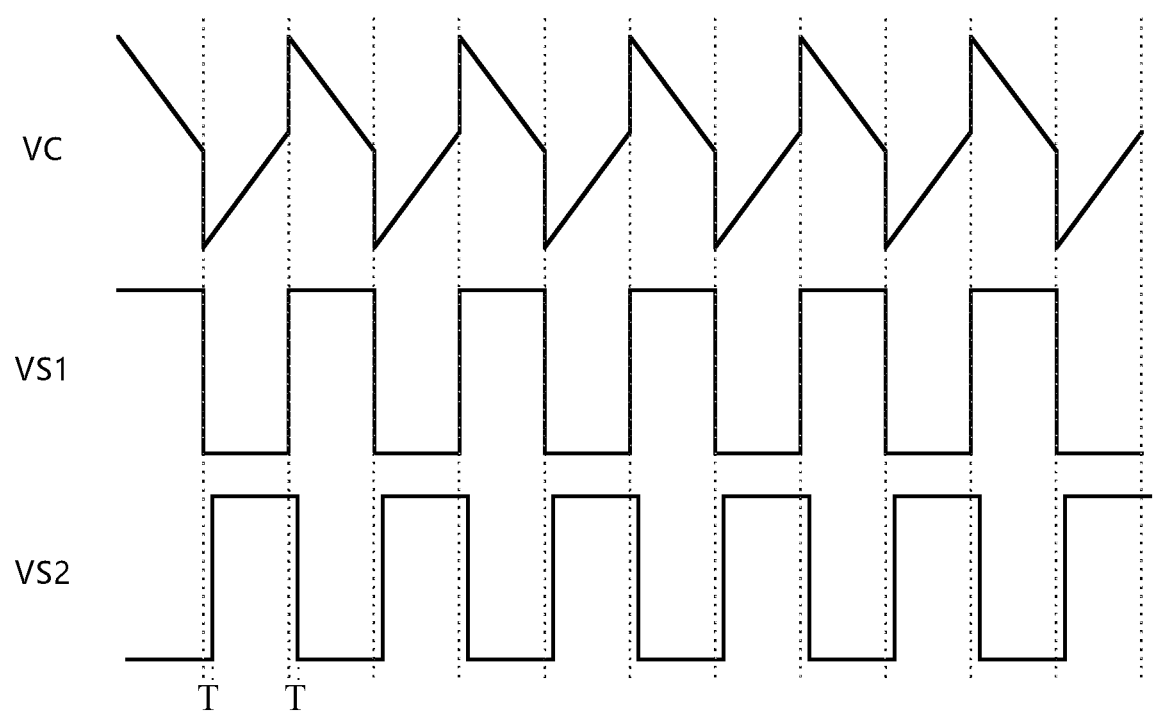
FIG. 3 shows a timing chart of a voltage VC, a control signal VS1 and a clock signal VS2.
Figure 4:
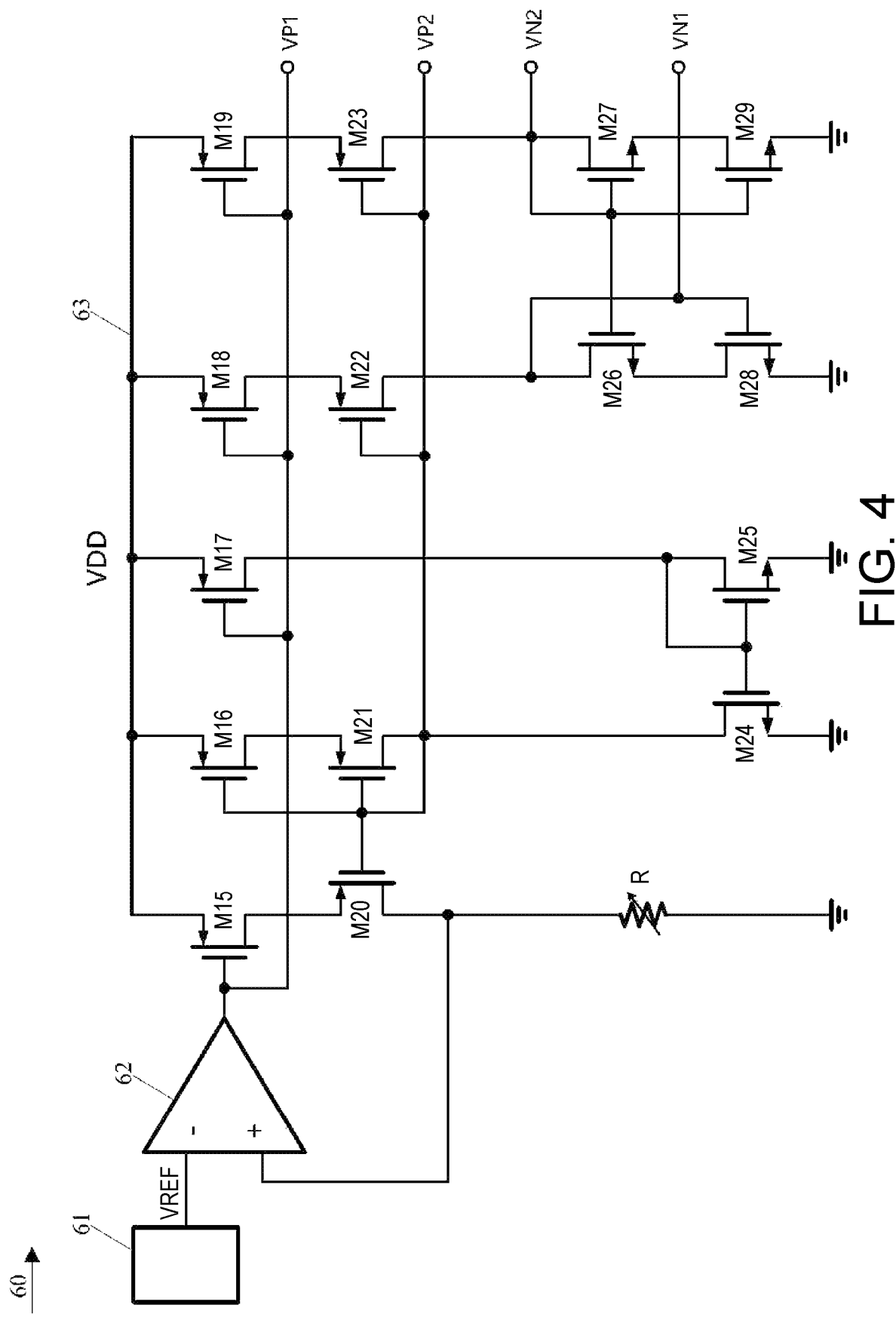
FIG. 4 shows a schematic diagram of a bias circuit in FIG. 1.

As shown in FIG. 2, the output circuit 50 in this embodiment, comprises a first inverter A1, a second inverter A2 and a third inverter A3 which are connected in sequence. An output of the switch circuit 30 is connected to the charging-discharging capacitor 40 and the first inverter A1. The third inverter A3 outputs a clock signal VS2, the second inverter A2 outputs the control signal VS1 which is connected to the control end of the main charging transistor M4 and the main discharging transistor M6. The timing of the control signal VS1 is ahead of the clock signal VS2 based on the delay of the third inverter A3. However, a specific structure of the output circuit is not limited in the present invention. Other circuits that can output the clock signal VS2 and the control signal VS1 in advance are within the scope of protection of the present invention, such as a combined output circuit of a flip-flop and a delay circuit.

In this embodiment, the first inverter A1, the second inverter A2 and the third inverter A3 have the same structure, and are all CMOS inverters composed of one PMOS transistor and one NMOS transistor. Specifically, a PMOS transistor M9 and a NMOS transistor M10 constitute the first inverter A1. A PMOS transistor M1*l* and a NMOS transistor M12 constitute a second inverter A2. A PMOS transistor M13 and a NMOS transistor M14 constitute the third inverter A3. However, a specific structure of the inverter is not limited in the present invention.

As shown in FIG. 2, in this embodiment, the charging-discharging capacitor 40 comprises a first capacitor C1 and a second capacitor C2, one end of the first capacitor C1 is connected to an output of the second inverter A2, and the other end of the first capacitor C1 is grounded via the second capacitor C2. The output of the switch circuit 40 is connected to a junction of the first capacitor C1 and the second capacitor C2 to adjust a charging-discharging node voltage based on the first capacitor C1 and the second capacitor C2.

The charging-discharging node voltage is a valley voltage and a peak voltage of the voltage VC. The introduction of the first capacitor C1 realizes the rise and fall of the voltage VC on the charging-discharging capacitor 40, increases the charging-discharging time, increases an amplitude of the voltage VC, and improves a stability of the circuit. However, a specific composition of the charging-discharging capacitor is not limited in the present invention. In other embodiments, the charging-discharging capacitor may only comprise one capacitor only, wherein one end of the capacitor is connected to an output end of the switch circuit and an input end of the first inverter, and the other end of the capacitor is grounded.

Variations of the voltage VC will be described in detail below with reference to FIG. 2 and FIG. 3. For convenience of description, an output voltage of the first inverter A1 is defined as VB.

In FIG. 2, seen from a VC node, the first capacitor C1 and the second capacitor C2 are connected in parallel, so when the voltage VC changes at a constant speed in a charging-discharging stage, the corresponding capacitance value is a sum capacitance of the two capacitors. Seen from the VS1 node, the first capacitor C1 and the second capacitor C2 are connected in series, so the variation of the voltage VC caused by the change of the VS1 node is a partial voltage of the corresponding reactance of the two capacitors.

Waveforms of the voltage VC of the charging-discharging capacitor, the control signal VS1 and the clock signal VS2 are shown in FIG. 3. It is assumed that in an initial stage, the control signal VS1 is at high level and the clock signal VS2 is at low level; in this case, the auxiliary charging transistor M3 and the main discharging transistor M6 are switched on, the main charging transistor M4 and the auxiliary discharging transistor M5 are switched off, the first capacitor C1 and the second capacitor C2 are discharged through the discharging circuit 20, and the voltage VC drops at a constant speed. When the voltage VC drops to a turnover voltage of the first inverter A1 composed of the PMOS transistor M9 and the NMOS transistor M10, the output voltage VB of the first inverter A1 becomes high level, and the control signal VS1 becomes low level, that is, one end of the first capacitor C1 connected to the control signal VS1 (i.e., an output end of the second inverter A2) suddenly drops and an amplitude of the drop is VDD voltage. Based on the fact that the total charges of the first capacitor C1 and the second capacitor C2 can't suddenly change and the two capacitors are connected in series seen from the VS1 node, the voltage VC suddenly drops and the amplitude of the drop is a partial voltage of the reactance corresponding to the first capacitor C1, which is VDD*C1/(C1+C2). At the same time, the main charging transistor M4 controlled by the control signal VS1 is switched on and the main discharging transistor M6 is switched off. The auxiliary charging transistor M3 controlled by the clock signal VS2 is closed after a time delay of T, and the auxiliary discharging transistor M5 is switched on after a time delay of T. That is, in the delay period T, both the main charging transistor M4 and the auxiliary charging transistor M3 are in turn-on state, so that the drain voltage VT1 of the first isolation transistor M2 fluctuates in a small range.

After the delay time T, the clock signal VS2 becomes high level, and the auxiliary charging transistor M3 is switched off. The charging circuit 10 charges the first capacitor C1 and the second capacitor C2 through the main charging transistor M4, and the voltage VC rises at a constant speed. When the voltage VC rises to the inversion voltage of the first inverter A1 composed of the PMOS transistor M9 and the NMOS transistor M10, the output voltage VB of the first inverter A1 becomes low level, and the VS1 becomes high level, that is, one end of the first capacitor C1 connected to the VS1 suddenly rises, and an amplitude of the rising amplitude is VDD voltage. Based on the fact that the total charges of the first capacitor C1 and the second capacitor C2 can't suddenly change and the two capacitors are connected in series seen from the VS1 node, the voltage VC abruptly rises and the amplitude of the rising is the partial voltage of the reactance corresponding to the first capacitor C1, that is, VDD*C1/(C1+C2). At the same time, the main charging transistor M4 is switched off, the main charging transistor M6 is switched on, and the first capacitor C1 and the second capacitor C2 are accessed to the discharging circuit 20. The auxiliary discharging transistor M5 is switched off after the delay time T. Similarly, during the delay time T, both the main charging transistor M6 and the auxiliary discharging transistor M5 are switched on to keep a drain voltage of the second isolating transistor M7 to fluctuate in a small range.

According to FIG. 3, it can be seen intuitively that after the first capacitor C1 is introduced, the amplitude of the voltage VC increases by VDD*C1/(C1+C2), and the amplitude of the voltage VC can be adjusted by adjusting the capacitance of the first capacitor C1 and the second capacitor C2. A larger amplitude is beneficial to improve the stability of the circuit. Certainly, the adjustment of the amplitude of the voltage VC needs to take account of the main charging transistor M4 and the main discharging transistor M6, so as not to make drains and sources of the main charging transistor M4 and the main discharging transistor M6 turn over to cause reverse conduction. In addition, the first capacitor C1 also increases the charging-discharging time. When the clock signal VS2 with the same oscillation frequency is realized, the second capacitor C2 with small capacitance can be used to realize the miniaturized design of the circuit.

In this embodiment, the relaxation oscillating circuit further comprises a bias circuit 60 that provides four bias voltages VP1,VP2,VN1 and VN2 and a temperature independent charging-discharging current for the first current source 11, the first isolating transistor M2, the second current source 21 and the second isolating transistor M7. In the relaxation oscillating circuit provided by this embodiment, the temperature stability of the circuit is determined by the charging-discharging capacitor 40 and the charging-discharging current. The first capacitor C1 and the second capacitor C2 have good temperature performances, and the temperature independent charging-discharging current provided by the bias circuit 60 can ensure a good temperature stability of an oscillator.

Specifically, in this embodiment, the bias circuit 60 comprises a bandgap reference circuit 61, a transconductance amplifier 62 and a bias voltage generating circuit 63. The bandgap reference circuit 61 provides a temperature independent reference voltage VREF. The negative input of the transconductance amplifier 62 is connected to the bandgap reference circuit 61, and the positive input is connected to the temperature independent resistor R. The reference voltage VREF and a resistance of the temperature independent resistor R determine the temperature independent current VREF/R output by the bias circuit 60, providing a bias for the first current source 11 and the second current source 21 through the current mirror to ensure a temperature stability of the charging-discharging current. The temperature independent resistor R may be composed of at least one positive temperature coefficient resistor and at least one negative temperature coefficient resistor.

An output end of the transconductance amplifier 62 is the bias voltage VP1 of the first switch transistor in the first current source. The bias voltage generating circuit 63 is connected to an output of the transconductance amplifier 62 and the temperature independent resistor R, and outputs a bias voltage VP1 of the first switch transistor and a bias voltage VP2 of the first isolating transistor, and a bias voltage VN1 of the second switch transistor and a bias voltage VN2 of the second isolating transistor.

Specifically, the bias voltage generating circuit 63 comprises PMOS transistors M15, M16, M17, M18, M19, M20, M21, M22 and M23, and NMOS transistors M24, M25, M26, M27, M28 and M29. The reference voltage VREF output by the bandgap reference circuit 61 is a temperature independent signal and is connected to the negative input end of the transconductance amplifier 62. The output of the transconductance amplifier 62 is connected to gates of the PMOS transistors M15, M17, M18 and M19, and this voltage is the bias voltage VP1 of the plurality of first switch transistors in the first current source.

Sources of the PMOS transistors M15, M16, M17, M18 and M19 are all connected to the power supply VDD. A drain of the PMOS transistor M15 is connected to a source of the PMOS transistor M20, and a gate of the PMOS transistor M20 is connected to gates of the PMOS transistors M16, M21, M22 and M23 and a drain of PMOS transistor M21, forming the bias voltage VP2 of the first isolating transistor M2. A drain of the PMOS transistor M20 is connected to one end of the temperature independent resistor R and the positive input end of the transconductance amplifier 62, and the other end of the temperature independent resistor R is grounded. A drain of the PMOS transistor M21 is connected to a drain of the NMOS transistor M24, a source of the NMOS transistor M24 is grounded, a gate of the NMOS transistor M24 is connected to a gate and a drain of the NMOS transistor M25 and a drain of the PMOS transistor M17, and a source of the NMOS transistor M25 is grounded.

A drain of the PMOS transistor M18 is connected to a source of the PMOS transistor M22, and a drain of the PMOS transistor M22 is connected to a drain of the PMOS M26 and a gate of the NMOS transistors M28, forming the bias voltage VP1 of the plurality of second switch transistors in the second current source 21. A source of the NMOS transistors M26 is connected to a drain of the NMOS transistors M28, and a source of the NMOS transistors M28 is grounded.

A gate of the NMOS transistors M26 is connected to gates of the NMOS transistors M27 and M29. A drain of the PMOS transistor M19 is connected to a source of the PMOS transistor M23, and a drain of the PMOS transistor M23 is connected to a gate and a drain of the NMOS transistor M27, forming the bias voltage VN2 of the second isolating transistor M7. A source of the PMOS transistor M27 is connected to a drain of the PMOS transistor M29, and a source of the PMOS transistor M29 is grounded.

In this embodiment, the PMOS transistor M16 and the NMOS transistor M29 work in a resistor region, and the other transistors work in a saturation region. Adjusting equivalent resistances of the PMOS transistor M16 and the NMOS transistor M29 can adjust voltages from sources to drains of the PMOS transistors M15, M17, M18 and M19 and the NMOS transistor M28 respectively.

In the bias voltage generating circuit 63 provided by this embodiment, the PMOS transistors M15, M17, M18 and M19 and the plurality of first open transistors M1_1, M1_2, . . . , M1_N in the first current source 11 are arranged as mirror, while the NMOS transistors M24, M25 and M28 and the plurality of second switch transistors M8_1, M8_2, ..., M8_N in the second current source are arranged as mirror, so the bias voltage generating circuit 63 provides temperature independent charging current and discharging current as mirror for the first current source 11 and the second current source 21, respectively.

In conclusion, in the relaxation oscillating circuit provided by the present invention, the charging circuit and the discharging circuit respectively adopt the first isolating transistor and the second isolating transistor to isolate the first current source and the second current source, so as to avoid the influence of the large parasitic capacitors of the two current sources on the charging-discharging capacitor, thus greatly improving the frequency accuracy of the clock signal. Further, in the switch circuit, the auxiliary charging transistor and the main charging transistor are arranged as mirror, and the auxiliary discharging transistor and the main discharging transistor are arranged as mirror; and the control signal for controlling the main charging transistor and the main discharging transistor is reversed with the clock signal and ahead of the clock signal for controlling the auxiliary charging transistor and the auxiliary discharging transistor. With this arrangement, when the clock signal turns over, the main charging transistor may be switched on ahead of the switching-off of the auxiliary charging transistor. During this time period, both the main charging transistor and the auxiliary charging transistor are switched on. In this case, the change of the drain voltage of the first isolating transistor is only related to gate-source voltages of the main charging transistor and the auxiliary charging transistor, and this voltage change is very small, thus greatly reducing influences of a drain capacitor of the first isolating transistor on the charging-discharging capacitor. Similarly, the main discharging transistor is also switched on ahead of the switching-off of the auxiliary discharging transistor. In this case, the change of the drain voltage of the second isolating transistor is only related to gate-source voltages of the main discharging transistor and the auxiliary discharging transistor, which effectively reduces influences of a drain capacitor of the second isolating transistor on the charging-discharging capacitor, and further improves the output accuracy of the clock signal.

Although the present invention has been disclosed by the preferred embodiments as above, it is not intended to limit the present invention, and anyone skilled in the art may make slight changes and embellishments without departing from the spirit and scope of the present invention, so the scope of protection of the present invention shall be subject to the scope of protection claimed in the claims.

What is claimed is:

1. A relaxation oscillating circuit, comprising:
    a charging circuit, comprising a first current source and a first isolating transistor for isolating a parasitic capacitor of the first current source;
    a discharging circuit, comprising a second current source and a second isolating transistor for isolating a parasitic capacitor of the second current source;
    a switch circuit, comprising a main charging transistor and an auxiliary charging transistor arranged as mirror and a main discharging transistor and an auxiliary discharging transistor arranged as mirror, wherein the first current source is connected to the main charging transistor and the auxiliary charging transistor via the first isolating transistor, and the second current source is connected to the main discharging transistor and the auxiliary discharging transistor via the second isolating transistor;
    a charging-discharging capacitor, connected to the main charging transistor and the main discharging transistor respectively, the main charging transistor and the main discharging transistor are alternately conducted for two half cycles of a clock signal, and access the charging-discharging capacitor to the charging circuit and the discharging circuit respectively; and
    an output circuit, based on a voltage of the charging-discharging capacitor, outputting a clock signal and a control signal which is reversed with the clock signal and ahead of the clock signal in timing, wherein the clock signal is accessed to control ends of the auxiliary charging transistor and the auxiliary discharging transistor, the control signal is accessed to control ends of the main charging transistor and the main discharging transistor respectively;
    the first current source comprises at least one first switch transistor in cascode structure with the first isolating transistor, and a size of the first isolating transistor is smaller than a size of the first switch transistor; and the second current source comprises at least one second switch transistor in cascode structure with the second isolating transistor, and a size of the second isolating transistor is smaller than that of the second switch transistor.

2. The relaxation oscillating circuit according to claim 1, wherein when the first current source comprises a plurality of first switch transistors arranged as mirror, a number of the first switch transistors accessed is adjusted to trim a charging current; and when the second current source comprises a plurality of second switch transistors arranged as mirror, a number of the second switch transistors accessed is adjusted to trim a discharging current.

3. The relaxation oscillating circuit according to claim 2, wherein the first current source further comprises a plurality of first single-pole double-throw switches arranged corresponding to the plurality of first switch transistors, movable ends of the first single-pole double-throw switches are connected to control ends of the corresponding first switch transistors, and two fixed ends of the first single-pole double-throw switches are connected to a power supply and bias voltages of the first switch transistors respectively; the second current source further comprises a plurality of second single-pole double-throw switches arranged corresponding to the plurality of second switch transistors, movable ends of the second single-pole double-throw switches are connected to control ends of the corresponding second switch transistors, and two fixed ends of the second single-pole double-throw switches are connected to ground and bias voltages of the second switch transistors respectively.

4. The relaxation oscillating circuit according to claim 1, wherein the output circuit comprises a first inverter, a second inverter and a third inverter which are connected in sequence, an output of the switch circuit is connected to the charging-discharging capacitor and the first inverter respectively, the third inverter outputs a clock signal, the second inverter outputs the control signal connected to the control ends of the main charging transistor and the main discharging transistor, and the timing of the control signal is ahead of the clock signal based on a delay of the third inverter.

5. The relaxation oscillating circuit according to claim 4, wherein the charging-discharging capacitor comprises a first capacitor and a second capacitor, one end of the first capacitor is connected to an output of the second inverter, the other end of the first capacitor is grounded via the second capacitor, and the output of the switch circuit is connected to a junction of the first capacitor and the second capacitor to adjust a charging-discharging node voltage based on the first capacitor and the second capacitor.

6. The relaxation oscillating circuit according to claim 1, wherein the relaxation oscillating circuit further comprises a bias circuit which provides a bias voltage and a temperature independent charging-discharging current for the first current source, the first isolating transistor, the second current source and the second isolating transistor.

7. The relaxation oscillating circuit according to claim 6, wherein the bias circuit comprises:
- a bandgap reference circuit, which provides a temperature independent reference voltage;
- a transconductance amplifier, with a negative input end connected to the bandgap reference circuit, and a positive input end connected to a temperature independent resistor, the reference voltage and a resistance value of the temperature independent resistor determine the temperature independent charging-discharging current output by the bias circuit; and
- a bias voltage generating circuit, connected to an output of the transconductance amplifier and the temperature independent resistor, and outputting a bias voltage of a first switch transistor and a bias voltage of the first isolating transistor in the first current source, and a bias voltage of a second switch transistor and a bias voltage of the second isolating transistor in the second current source respectively.

8. The relaxation oscillating circuit according to claim 7, wherein the temperature independent resistor is composed of at least one positive temperature coefficient resistor and at least one negative temperature coefficient resistor.

\* \* \* \* \*